United States Patent
Roch et al.

(10) Patent No.: US 12,143,072 B2
(45) Date of Patent: Nov. 12, 2024

(54) PROGRESSIVE WAVE, LOW CHARACTERISTIC IMPEDANCE PARAMETRIC AMPLIFIER AND MANUFACTURING METHOD THEREOF

(71) Applicant: Centre National De La Recherche Scientifique, Paris (FR)

(72) Inventors: Nicolas Roch, Grenoble (FR); Luca Planat, Grenoble (FR)

(73) Assignee: Centre National De La Recherche Scientifique, Paris (FR)

( * ) Notice: Subject to any disclaimer, the term of this patent is extended or adjusted under 35 U.S.C. 154(b) by 607 days.

(21) Appl. No.: 17/432,690

(22) PCT Filed: Feb. 17, 2020

(86) PCT No.: PCT/EP2020/054025
§ 371 (c)(1),
(2) Date: Aug. 20, 2021

(87) PCT Pub. No.: WO2020/169503
PCT Pub. Date: Aug. 27, 2020

(65) Prior Publication Data
US 2022/0021362 A1 Jan. 20, 2022

(30) Foreign Application Priority Data
Feb. 21, 2019 (FR) ..................................... 1901767

(51) Int. Cl.
*H03F 3/187* (2006.01)
*H03F 19/00* (2006.01)
(Continued)

(52) U.S. Cl.
CPC ......... *H03F 19/00* (2013.01); *H10N 60/0912* (2023.02); *H10N 60/805* (2023.02)

(58) Field of Classification Search
CPC ....................................................... H03F 3/187
(Continued)

(56) References Cited

U.S. PATENT DOCUMENTS 4,158,177 A  6/1979 Archambault et al.
4,869,598 A * 9/1989 McDonald ............. H10N 60/84
                                                        374/176
(Continued)

OTHER PUBLICATIONS

Bedra, Sami, et al., "High-$T_c$ superconducting rectangular microstrip patch covered with a dielectric layer", Physica C, Superconductivity and its Applications, Mar. 22, 2016, pp. 31-36, vol. 524, Elsevier B.V., Netherlands.
(Continued)

*Primary Examiner* — Henry Choe
(74) *Attorney, Agent, or Firm* — Maier & Maier, PLLC

(57) ABSTRACT

A traveling wave superconducting parametric amplifier is provided. The traveling wave superconducting parametric amplifier includes a chain of superconducting elements having a nonlinear kinetic inductance connected in series, said superconducting elements being deposited on a substrate. The traveling wave superconducting parametric amplifier also includes a dielectric layer of sub-micrometer thickness deposited on the substrate and covering said superconducting elements, and a conductive layer forming a ground plane deposited on top of the dielectric layer, the superconducting elements and the ground plane forming a microstrip-type transmission line. A method for producing such a traveling wave parametric amplifier is also provided.

14 Claims, 4 Drawing Sheets

Figure 1A:
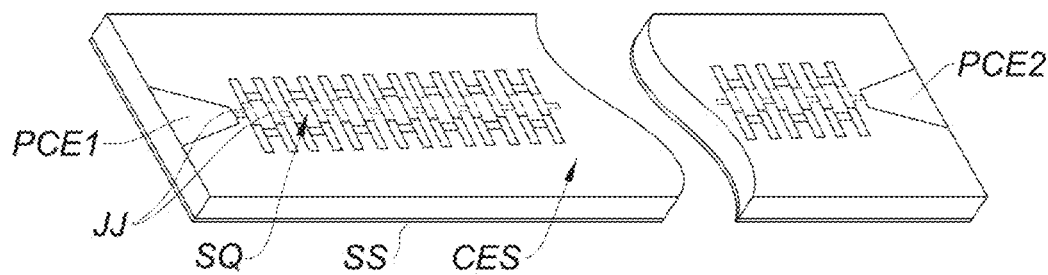

(51) Int. Cl.
  *H10N 60/01* (2023.01)
  *H10N 60/80* (2023.01)
(58) Field of Classification Search
  USPC .................................................. 330/307, 302
  See application file for complete search history.

(56) References Cited

U.S. PATENT DOCUMENTS

| | | | | |
|---|---|---|---|---|
| 9,509,315 | B2 * | 11/2016 | McCaughan | H10N 60/84 |
| 10,145,743 | B2 * | 12/2018 | Timofeev | H10N 15/00 |
| 10,305,015 | B1 * | 5/2019 | Brink | H10N 69/00 |
| 10,593,858 | B2 * | 3/2020 | Brink | H01P 3/082 |
| 11,317,519 | B2 * | 4/2022 | Abdo | H03H 7/0161 |
| 2012/0098594 | A1 | 4/2012 | Zmuidzinas et al. | |
| 2018/0034425 | A1 | 2/2018 | Bell et al. | |

OTHER PUBLICATIONS

Chaudhuri, S., et al., "Broadband parametric amplifiers based on nonlinear kinetic inductance artificial transmission lines", arXiv:1704.00859v1, Apr. 4, 2017, 5 pages, Cornell University Online Library, U.S.

Eom, Byeong Ho, et al., "A wideband, low-noise superconducting amplifier with high dynamic range", Nature Physics 8.8, Jan. 12, 2012, vol. 623, retrieved from the Internet at <https://arxiv.org/pdf/1201.2392.pdf> on Aug. 20, 2021, 23 pages, Cornell University Online Library, U.S.

International Searching Authority, International Search Report (ISR) and Written Opinion received for International Application No. PCT/EP2020/054025, dated May 26, 2020, 16 pages, European Patent Office, Netherlands.

Lecocq, F., et al., "Junction fabrication by shadow evaporation without a suspended bridge", Nanotechnology, Aug. 2011, 7 pages, vol. 22, No. 315302, retrieved from the Internet at <https://www.researchgate.net/publication/51475655_Junction_fabrication_by_shadow_evaporation_without_a_suspended_bridge/link/55df6e9608aecbla7cclaldf/download> on Aug. 20, 2021.

Macklin, C., et al., "A near-quantum-limited Josephson traveling-wave parametric amplifier", Science, Oct. 16, 2015, pp. 307-310, vol. 350, No. 6258, retrieved from the Internet at <https://science.sciencemag.org/content/350/6258/307/tab-pdf> on Aug. 20, 2021.

National Industrial Property Institute, Preliminary Search Report and Written Opinion received for Application No. FR 1901767, dated Dec. 13, 2019, 11 pages, Republic of France.

Planat, Luca, et al., "Understanding the saturation power of Josephson Parametric Amplifier made from SQUIDs arrays", arXiv: 1809.08746v1 and v2, Sep. 22, 2018 and Apr. 3, 2019, receptively, 26 pages, Cornell University Online Library, U.S.

Shan, Wenlei, et al., "Parametric Amplification in a Superconducting Microstrip Transmission Line", IEEE Transactions on Applied Superconductivity, Sep. 2016, 9 pages, vol. 26, No. 6, IEEE, U.S.

White, T. C., et al., "Travelling wave parametric amplifier with Josephson junctions using minimal resonator phase matching", Applied Physics Letters, Jun. 15, 2015, vol. 106, No. 242601, 5 pages, AIP Publishing Co., US.

* cited by examiner

PROGRESSIVE WAVE, LOW CHARACTERISTIC IMPEDANCE PARAMETRIC AMPLIFIER AND MANUFACTURING METHOD THEREOF

CROSS-REFERENCE TO RELATED APPLICATIONS

This application is a national phase entry of PCT/EP2020/054025, filed on Feb. 17, 2020, which claims the benefit of priority of French Patent Application No. 1901767, filed on Feb. 21, 2019, the contents of which being hereby incorporated by reference in their entirety for all purposes.

FIELD

The invention relates to a traveling wave-type superconducting parametric amplifier. More particularly, it relates to such an amplifier exhibiting a relatively low characteristic impedance, for example of the order of 50 Ohms.

BACKGROUND

Parametric amplifiers are well known in nonlinear optics. They make use of second-order (three-wave mixing) or third-order (four-wave mixing) nonlinear effects to transfer energy from an optical pump beam to an optical signal to be amplified. Four-wave mixing may be obtained in an optical fiber, which makes it possible to obtain a substantial length of interaction between the pump and the signal, and therefore a high gain.

More recently, parametric amplifiers have been produced in the radiofrequency domain and more particularly in the microwave-frequency domain (1-300 GHz). These amplifiers use electronic components that exhibit nonlinear behavior. They may be, for example, superconducting elements such as Josephson junctions or SQUIDs ("superconducting quantum interference devices"—which consist of two Josephson junctions connected in parallel in a superconducting loop). Josephson junctions and SQUIDs exhibit a kinetic inductance that is quadratically dependent on the current density, and therefore plays a role equivalent to the Kerr effect (third order nonlinearity) in optics. Additionally, in the case of SQUIDs, the value of this nonlinear inductance may be adjusted by varying the magnetic flux which passes through the device.

The main advantage of parametric radiofrequency/microwave-frequency amplifiers lies in their very low noise level, close to the quantum limit and an order of magnitude lower than the best semiconductor amplifiers available.

The gain provided by a nonlinear element acting as a parametric amplifier is very low. To obtain significant gains, two approaches are possible:

Standing wave amplifier: the one or more nonlinear elements are placed in a resonant cavity. This also has the effect of drastically reducing the bandwidth, which may be a serious drawback in some applications.

Traveling wave amplifier: many nonlinear elements connected in series form a transmission line along which the signal propagates. This latter approach makes it possible to obtain a wider bandwidth, but only provided that the phase-matching condition is maintained between the pump and the signal to be amplified, which requires control of the dispersion in the transmission line. This problem is also well known in optics.

US 2012/0098594 and the article by (Eom 2012) describe traveling wave parametric amplifiers which make use of the nonlinear kinetic inductance of superconducting elements forming a transmission line. In the devices described by these documents, the control of the dispersion that makes it possible to achieve the phase-matching condition is obtained by way of periodic spatial modulation of the structure of the transmission line.

US 2018/0034425 describes a traveling wave parametric amplifier based on a SQUID chain. The phase-matching is achieved by controlling the magnetic flux through the SQUIDs. The document does not provide details on the concrete implementation of the amplifier.

The articles (White 2015) and (Macklin 2015), describe traveling wave parametric amplifiers based on a transmission line formed by Josephson junctions and parallel-plate capacitors connected to ground. The phase-matching is obtained by inserting, into the structure, at regular intervals, parallel LC resonators.

The article (Planet 2018) describes a resonant parametric amplifier using a chain of superconducting elements forming a nonlinear superconducting resonator.

The parametric amplifiers must be connected to external electronic systems—for example radiofrequency signal generators—which most often have an impedance of 50 Ohms, and generally lower than 100 Ohms. In order to minimize losses through reflection, it is important, in traveling wave amplifiers (but not in resonant amplifiers of the type in (Planat 2018)), that the characteristic impedance of the nonlinear transmission line take, around its operating point, a value that is as close as possible to the input or output impedance of the electronic systems to which the amplifier is to be connected.

The characteristic impedance Zo of a transmission line is given by $$Z_0 = \sqrt{\frac{L}{C}} \quad [\text{Math. 1}]$$

where L is the inductance per unit length and C is the capacitance per unit length.

However, a Josephson junction typically exhibits an inductance of the order of a few tens or hundreds of pH (picoHenries). To obtain a characteristic impedance of the order of a few tens or hundreds of Ohms, it is therefore necessary to associate a capacitance of a few fF (femtoFarads) therewith. For this reason, the parametric amplifiers described in (White 2015) and (Macklin 2015) comprise lumped capacitors which are substantially larger than the Josephson junctions. This approach negatively affects the compactness of the parametric amplifier. In addition, care must be taken that the dielectric of the capacitors does not introduce losses which degrade the performance of the amplifier.

BRIEF SUMMARY

The invention aims to overcome the abovementioned drawbacks of the prior art. More particularly, it aims to provide a compact traveling wave parametric amplifier which still exhibits a low characteristic impedance (typically, but not necessarily, lower than 100 Ohms and preferably about 50 Ohms).

According to the invention, this aim is achieved by using a structure which may be characterized as an "inverted microstrip", in which the chain of Josephson junctions or SQUIDs is covered with a dielectric layer with a thickness of a few tens of nanometers, on which a ground plane is deposited. The assembly behaves like a "microstrip"-type transmission line, but with a capacitance per unit length that is several orders of magnitude higher than that which would be obtained if, as is conventional, the ground plane were produced on the back face of the substrate, the thickness of which is generally at least 100 µm. In this way, a characteristic impedance of the order of a few tens or hundreds of Ohms may be obtained without having to resort to lumped-parameters capacitors.

According to one embodiment of the invention, in order to optimize the miniaturization of the parametric amplifier later on, phase-matching is obtained by periodically spatially modulating the dimensions of the Josephson junctions or SQUID, instead of by introducing LC oscillators.

Advantageously, the dielectric layer is produced using atomic layer deposition (ALD), which ensures excellent quality of the material and therefore low losses. A parametric amplifier according to the invention may be produced in a straightforward manner, using well-known technologies.

One subject of the invention is therefore a traveling wave superconducting parametric amplifier comprising a chain of superconducting elements having a nonlinear kinetic inductance connected in series, said superconducting elements being deposited on a substrate, characterized in that it further comprises a dielectric layer of sub-micrometer thickness deposited on the substrate and covering said superconducting elements, and a conductive layer forming a ground plane deposited on top of the dielectric layer, the superconducting elements and the ground plane forming a microstrip-type transmission line.

According to some particular embodiments of such a parametric amplifier:
   said dielectric layer may have a thickness of between 1 and 100 nm, and preferably of between 10 and 50 nm (the exact value depending on the desired characteristic impedance and on the inductance of the superconducting elements);
   said dielectric layer may be produced using atomic layer deposition;
   said dielectric layer may be made of alumina;
   the chain of superconducting elements and the thickness of the dielectric layer may be dimensioned such that the transmission line has an impedance of between 30 and 70 Ohms, and preferably of between 30 and 60 Ohms;
   the amplifier may further comprise at least one tapered conductive contact pad, the thinner end of which is electrically connected to one end of the chain of superconducting elements, in which the conductive layer forming a ground plane is structured so as to form, with said conductive contact pad, a coplanar-type transmission line segment impedance-matched to the microstrip-type transmission line; the amplifier may then further comprise at least one contact pin that is electrically connected to said or to each contact pad through the dielectric layer;
   at least one dimension of said superconducting elements exhibiting a nonlinear kinetic inductance may be spatially modulated so as to define a phase-matching spatial range for an electromagnetic wave;
   the amplifier may further comprise a generator of a microwave-frequency or radiofrequency pump signal;
   said superconducting elements exhibiting a nonlinear kinetic inductance may be selected from Josephson junctions and SQUIDs;
   more particularly, said superconducting elements exhibiting a nonlinear kinetic inductance may be SQUIDs, and the amplifier may further comprise a variable magnetic field source generating an adjustable flux through said SQUIDs.

Another subject of the invention is a method for producing such a traveling wave parametric amplifier, comprising the steps of:
   a) producing, on a substrate, using electron beam lithography, metal deposition and oxidation operations, a chain of superconducting elements of Josephson junction or SQUID type connected in series;
   b) producing, by way of atomic layer deposition on top of said substrate, a dielectric layer of sub-micrometer thickness covering said superconducting elements; and
   c) depositing a conductive layer forming a ground plane on top of the dielectric layer.

According to some particular embodiments of such a method:
   step a) may further comprise producing at least one tapered conductive contact pad, the thinner end of which is electrically connected to one end of the chain of superconducting elements, and step c) may further comprise a structuring of the conductive layer so as to form, with said conductive contact pad, a coplanar-type wave line segment impedance-matched to the microstrip-type transmission line formed by the chain of superconducting elements and the ground plane;
   the method may further comprise the following step of:
   d) connecting a contact pin to said or to each said contact pad by microsoldering through the dielectric layer.

BRIEF DESCRIPTION OF THE SEVERAL VIEWS OF THE DRAWING(S)

Figure 1B:
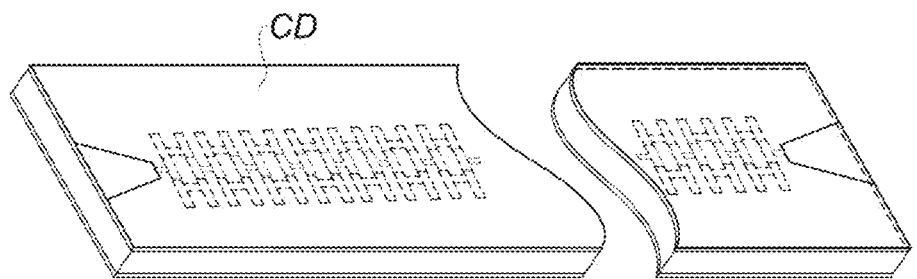
Figure 1C:
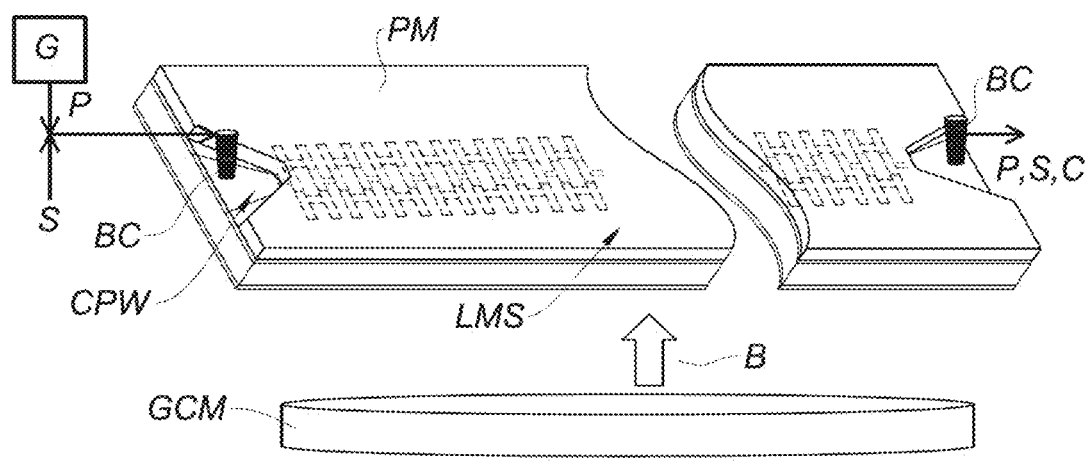
Figure 2A:
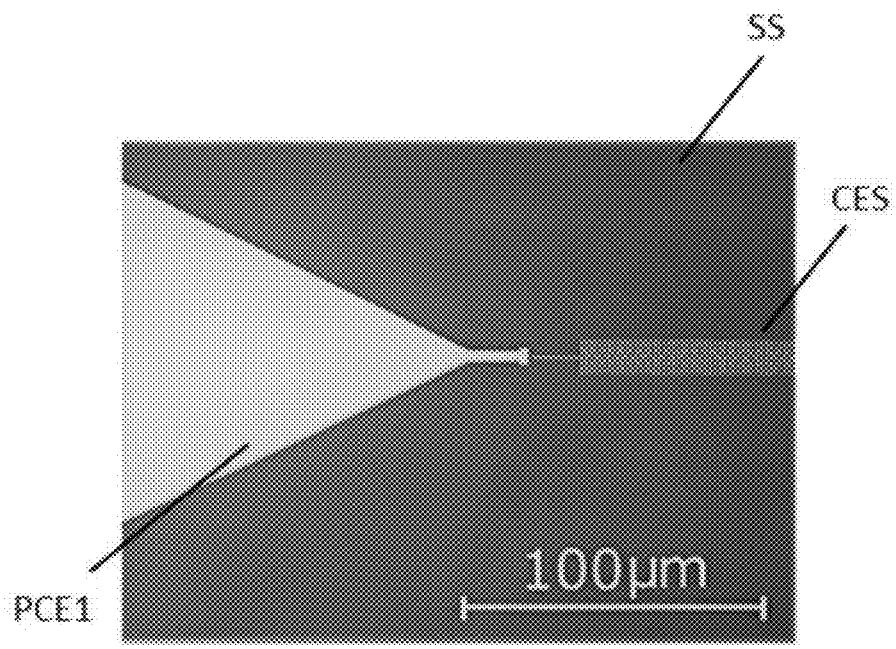
Figure 2B:
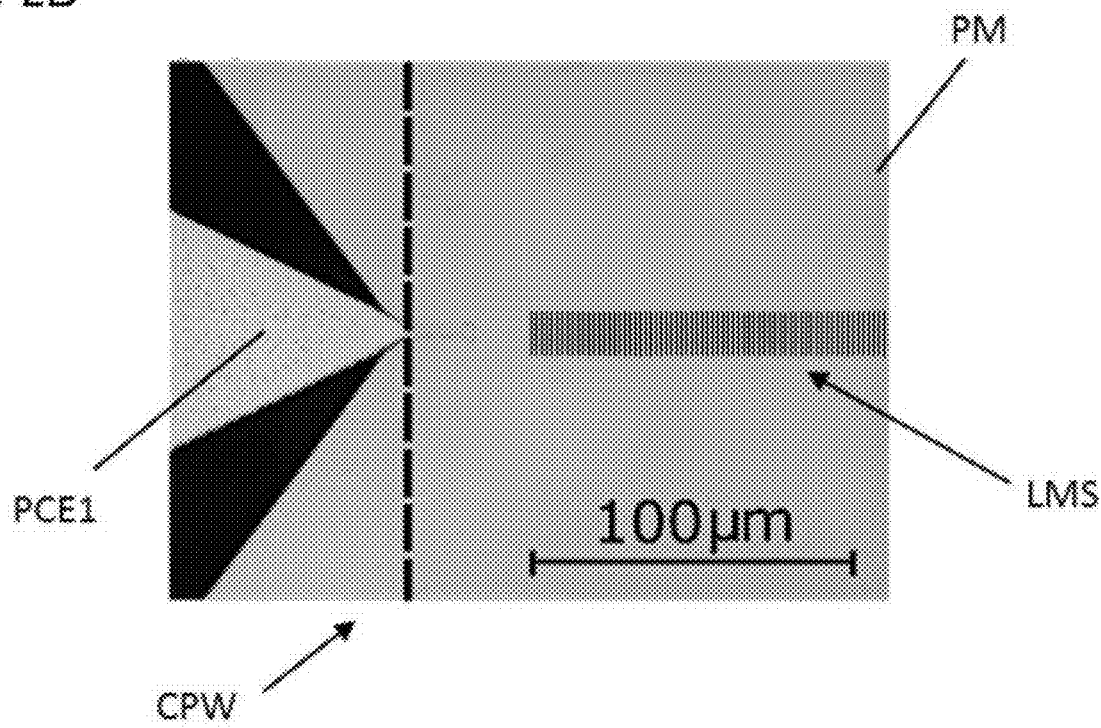
Figure 3:
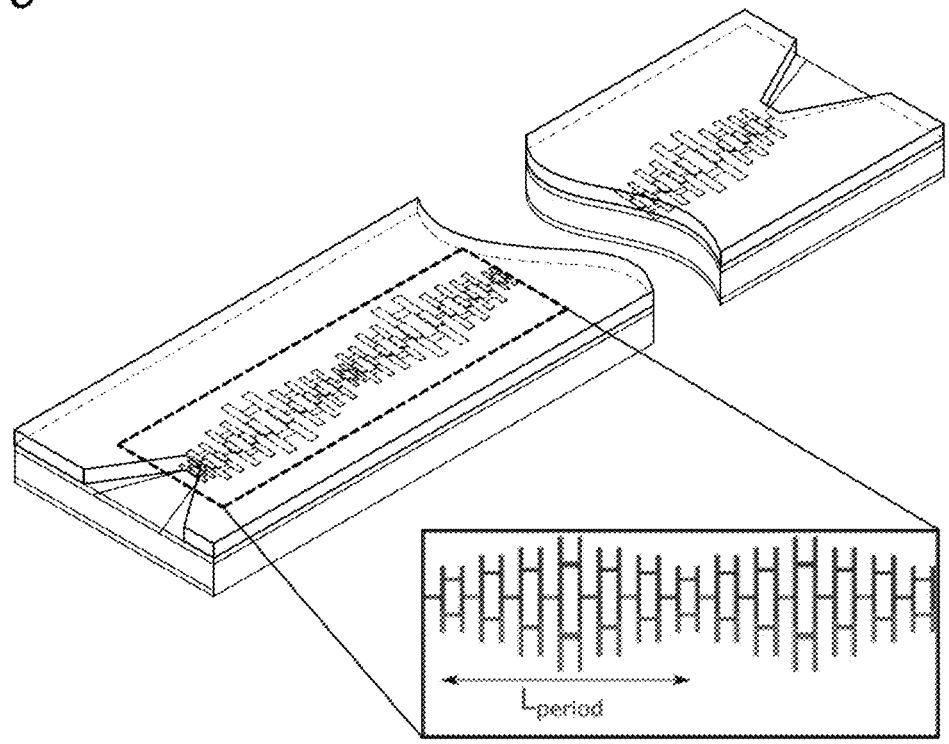
Figure 4:
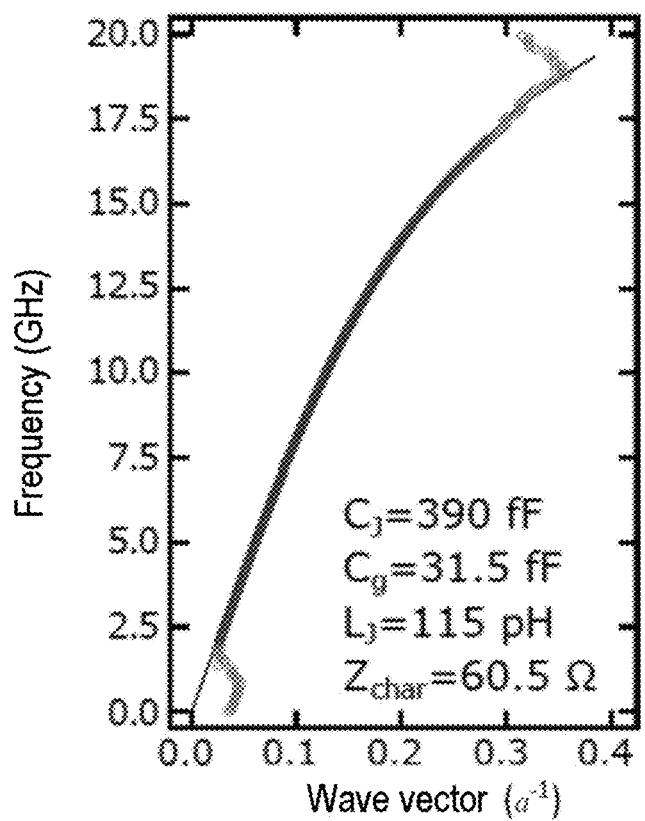
Figure 5:
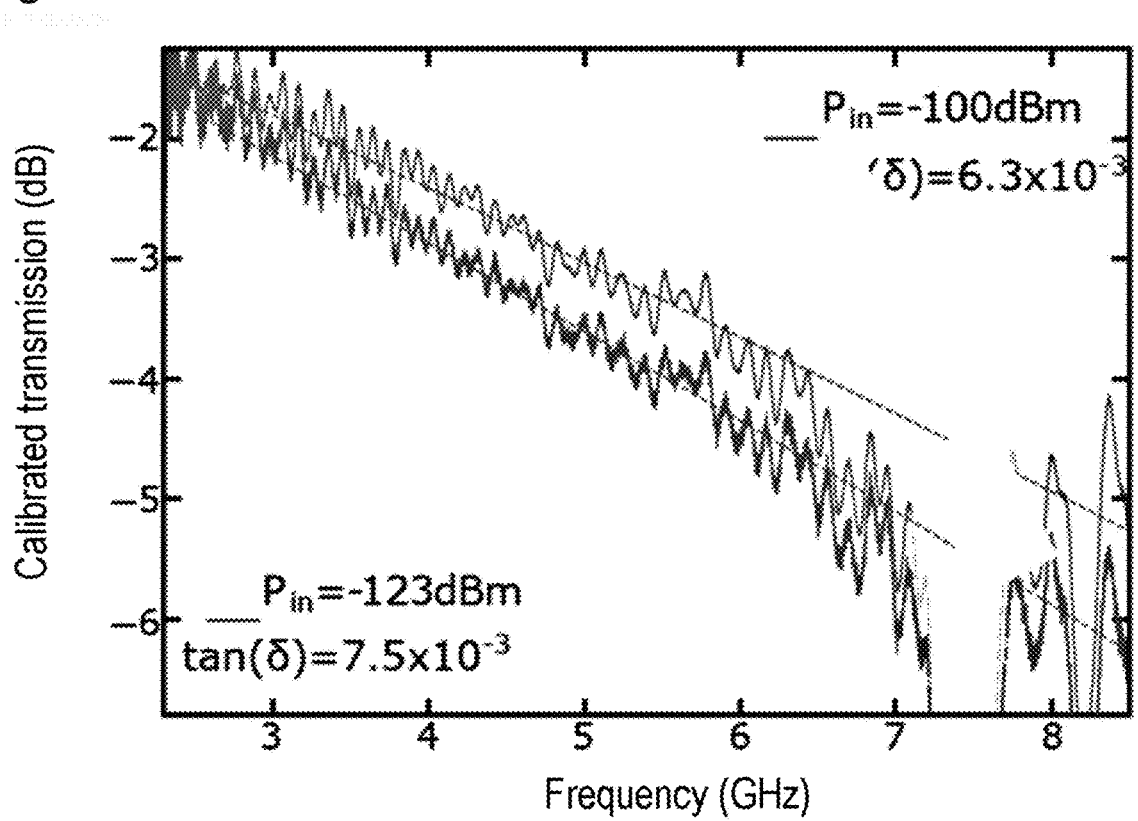
Figure 6:
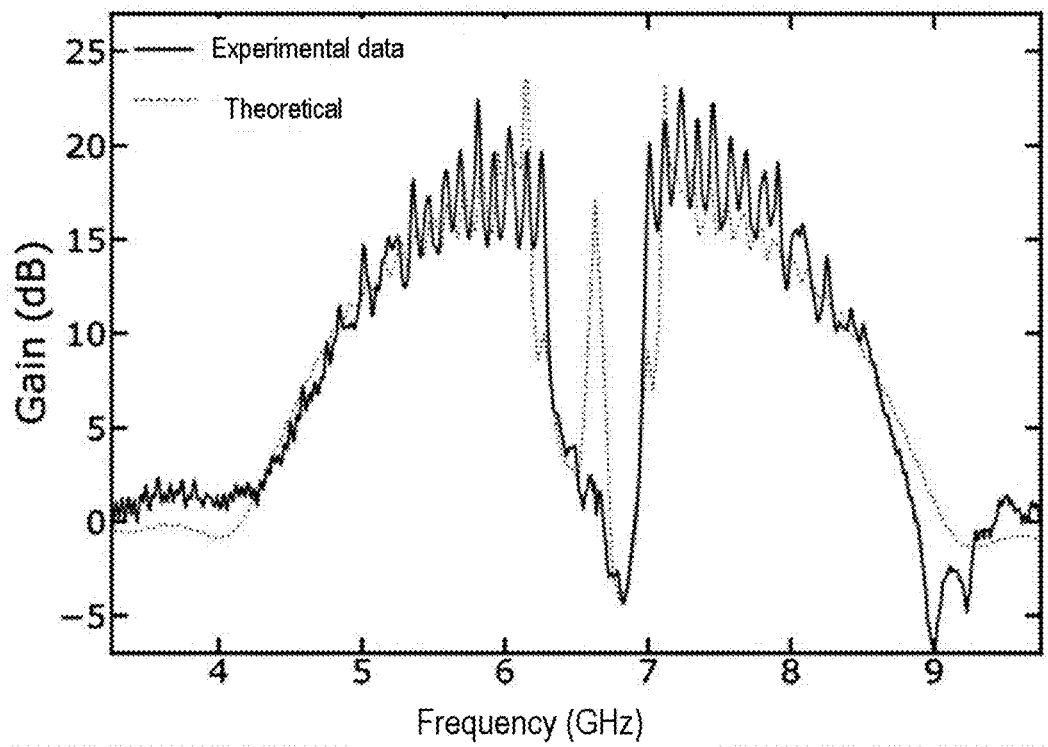

The appended drawings illustrate the invention:
FIG. 1A, FIG. 1B and FIG. 1C show a parametric amplifier according to one embodiment of the invention at various stages in its production;
FIG. 2A and FIG. 2B are detailed views of FIGS. 1B and 1C, respectively;
FIG. 3 schematically illustrates a modulation of the size of the superconducting elements allowing phase-matching to be obtained;
FIG. 4 is a graph illustrating the dispersion relationship of a parametric amplifier of the type of FIG. 1C,
FIG. 5 is a graph illustrating the losses in this parametric amplifier; and
FIG. 6 is a graph illustrating the gain profile of the same parametric amplifier.

DETAILED DESCRIPTION

The production of a traveling wave parametric amplifier according to the invention comprises three main steps, illustrated by FIG. 1A, FIG. 1B and FIG. 1C, respectively.

The first step, illustrated by FIG. 1A, is the production of the chain of superconducting elements CES (here, 2000 SQUIDs SQ each formed by two Josephson junctions JJ in parallel) on top of a substrate SS. In the example of FIGS. 1A-1C, the substrate is made of silicon and has a thickness of 275 µm; its back face is covered with a tie layer of Ti (10 nm) and a layer of gold (200 nm) whose function is essentially to ensure good thermal contact with a sample holder made of copper (it also forms a ground plane, but in the context of the invention this function is negligible).

The chain of superconducting elements is preferably produced using the "bridge-free fabrication" (BFF) technique described in (Lecocq 2011). According to this technique, a strongly asymmetric undercut is formed in a dual layer of resist using electron beam lithography. A first deposition of metal (Al) at a first angle with respect to the normal to the substrate makes it possible to produce structures, for example in the shape of an H. These structures are oxidized, and then a second deposition of metal is performed at a second angle, opposite to the first, to produce structures which partially cover those deposited and oxidized previously. Each oxidized metal/metal overlap forms a Josephson junction. Lastly, the resist is removed completely.

Each SQUID has a length (in the direction of propagation of the signals) of approximately 3 μm and a width of approximately 12 μm.

At each end, the chain CES ends in a track a few tens of micrometers in length, and then a contact pad PGE1, PCE2 of tapered shape (preferably triangular), of which FIGS. 2A and 2B show enlarged views.

The second step, illustrated by FIG. 1B, is the conformal deposition of a thin (for example, 28 nm) dielectric layer CD. In the example considered here, the dielectric is alumina and the deposition is performed using ALD at a temperature of between 150° C. and 200° C. using trimethylaluminum as precursor. It is not necessary to provide an additional method step to mask the contact pads: they may be covered with the dielectric layer which, due to its low thickness, may be pierced very easily when making contact (see infra, FIG. 1C). Thus, the deposition preferably covers the entire surface of the substrate, including the contact pads.

The second step, illustrated by FIG. 10, is the deposition of a metal layer forming a ground plane PM on top of the dielectric layer CD. It may, for example, be a layer of gold with a thickness of 200 to 1000 nm. The layer PM forms, with the dielectric layer CD and the chain of superconducting elements CES, a nonlinear microstrip transmission line LMS (the nonlinearity being due to the superconducting elements) which preferably has a characteristic impedance of about 50 Ohms (for example of between 30 and 70 Ohms, and preferably of between 30 and 60 Ohms).

The layer PM is structured, at the time of deposition or later on, so as to feature notches which clear the contact pads PCE1, PCE2. Typically, the structuring is performed by previously depositing a sacrificial layer of resist on the contact pads, which resist is removed after the metal has been deposited. The notches are wider than the contact pads, and have a larger vertex angle, so as to form therewith the tapered "coplanar" waveguide segments CPW which are impedance-matched to the transmission line LMS. The waveguides CPW are not truly coplanar, since the central conductors (pads PGE1, PCE2) are deposited directly on the substrate while the lateral conductors form part of the ground plane. However, the dielectric layer is so thin that in practice, from an electromagnetic point of view, the structure may be considered to be coplanar. FIG. 2B shows an enlarged view of the CPW-LMS transition.

As shown in FIG. 10, contact pins BC are connected by microsoldering to the contact pads PGE1, PCE2 through the dielectric layer CD, which is easily pierced. A first pad is used to inject a radiofrequency/microwave-frequency signal to be amplified S at a frequency $f_S$, and an electromagnetic pump wave P, which is more intense and has a frequency $f_P$—still at radiofrequency/microwave frequency—that is higher than $f_S/2$. The opposite pin makes it possible to retrieve the amplified signal, the attenuated pump and a third signal C—referred to as complementary or the "idler"—of frequency $f_C$. The principle of conservation of energy dictates the relationship $2f_P=f_S+f_C$. In FIG. 1C, the reference GP denotes a pump generator.

In a manner known per se, a magnetic field generator GCM, for example an electromagnet, may induce a magnetic field of adjustable intensity B, which passes through the SQUIDs in order to adjust their inductance. Specifically, it is known that the inductance of a SQUID is a nonlinear function of the magnetic flux that passes through it. This is made possible by the fact that the ground plane, made of gold, does not become superconducting.

Although not apparent in the figures, according to one preferred embodiment of the invention, the dimensions of the superconducting elements may be spatially modulated periodically. This modifies the dispersion relationship of the transmission line LMS by introducing a bandgap. The opening of this bandgap locally deforms the dispersion relationship which makes it possible to ensure, for a given operating point (pump intensity) and for a frequency range $f_S$, $f_C$, a phase-matching condition. The modulation may be small, for example about 6% of the dimensions of the Josephson junctions. FIG. 3 illustrates a parametric amplifier according to one embodiment of the invention in which the superconducting elements (SQUIDs) have a dimension (width) modulation with a period $L_{period}$. It is advantageous to note that the introduction of a spatial modulation of the dimensions of the superconducting elements does not introduce additional method steps.

The dispersion relationship of the transmission line LMS was measured using the method described in (Macklin 2015). The result of the measurement is illustrated in FIG. 4. It is possible to deduce therefrom the values of the capacitance of the Josephson junctions $C_J$ (390 fF), their inductance $L_J$ (115 pH), the capacitance to ground $C_g$ (31.5 fF) and the characteristic impedance (square root of $L_J/C_g$=60.5 Ohms approximately). It is verified that a characteristic impedance close to the target value of 50 Ohms is obtained (this is a prototype, better control of production conditions makes it possible to come closer to this target value). It is advantageous to note that this impedance value is obtained with very small elementary cells, having a length of about 3.2 μm, versus 16 μm for (Macklin 2015); in (White 2015), an elementary cell has three Josephson junctions and a capacitor and measures 67 μm, i.e. about 22 μm per Josephson junction. The advantage provided by the invention in terms of miniaturization is therefore clearly apparent.

FIG. 5 shows two transmission curves for the line LMS for two different values of the intensity of the pump wave: −100 dBm (upper curve) and −123 dBm. It can be seen that losses decrease as the intensity of the pump increases. These experimental curves make it possible to calculate a loss angle tan δ-δ of between $6.3 \cdot 10^{-3}$ and $7.5 \cdot 10^{-3}$, which confirms the excellent quality of the dielectric obtained using ALD.

FIG. 6 illustrates a gain curve measured on the device of FIGS. 4 and 5 (solid line) and the theoretical gain curve (dotted line). Disregarding the ripples, it can be seen that the gain reaches 18 dB with a bandwidth at −3 dB of about 3 GHz, cut in the middle by a bandgap of about 700 MHz.

The invention has been described with reference to one particular embodiment. However, it is not limited to this embodiment, and many variations are possible.

Materials other than those indicated (silicon for the substrate, aluminum for producing the Josephson junctions, alumina for the dielectric and gold for the ground plane) may be used. In particular, if it is not necessary to use a magnetic flux to finely tune the inductances of the Josephson junctions, the ground plane may in turn be superconducting.

Techniques other than BFF may be used to produce the Josephson junctions—for example, a technique involving the formation of a resist bridge. Likewise, the dielectric layer may be produced using any physical or chemical deposition technique, and not just using ALD. ALD deposited using plasma constitutes an advantageous alternative for minimizing losses in the dielectric.

Although the "inverted microstrip" structure of the invention is particularly advantageous in conjunction with the use of Josephson junctions (alone or forming SQUIDs), it may also be applied to the production of parametric amplifiers making use of other nonlinear superconducting elements, for example the thin films used in (Eom 2012).

The use of spatial modulation of the dimensions of the superconducting elements to obtain the phase-matching is particularly advantageous because it does not lead to any increase in the bulk of the parametric amplifier. However, other techniques, such as, for example, the insertion of resonators, may also be used.

BIBLIOGRAPHIC REFERENCES (Planat 2018) L. Planat et al. "Understanding the saturation power of Josephson Parametric Amplifier made from SQUIDs arrays", arXiv: 1809.08746v1

(Eom 2012): Byeong Ho Eom et al. "A wideband, low-noise superconducting amplifier with high dynamic range" Nature Physics 8.8 (2012): 623

(White 2015): T. C. White et al. "Travelling wave parametric amplifier with Josephson junctions using minimal resonator phase matching", Appl. Phys. Lett. 106, 242601 (2015)

(Macklin 2015): C. Macklin et al. "A near-quantum-limited Josephson traveling-wave parametric amplifier", Science, Vol. 350, Issue 6258, pages 307-310, 16 Oct. 2015

(Lecocq 2011): F. Lecocq et al. "Junction fabrication by shadow evaporation without a suspended bridge" Nanotechnology 22, 315302 (2011).

The invention claimed is:

1. A traveling wave superconducting parametric amplifier comprising a chain of superconducting elements having a nonlinear kinetic inductance connected in series, said superconducting elements being deposited on a substrate, characterized in that traveling wave superconducting parametric amplifier it further comprises a dielectric layer of sub-micrometer thickness deposited on the substrate and covering said superconducting elements, and a conductive layer forming a ground plane deposited on top of the dielectric layer, the superconducting elements and the ground plane forming a microstrip-type transmission line.

2. The traveling wave superconducting parametric amplifier as claimed in claim 1, wherein said dielectric layer has a thickness of between 1 and 100 nm.

3. The traveling wave superconducting parametric amplifier as claimed in claim 1, wherein said dielectric layer is produced by atomic layer deposition.

4. The traveling wave superconducting parametric amplifier as claimed in claim 3, wherein said dielectric layer is made of alumina.

5. The traveling wave superconducting parametric amplifier as claimed in claim 1, wherein the chain of superconducting elements and the thickness of the dielectric layer are dimensioned such that the transmission line has an impedance of between 30 and 70 Ohms.

6. The traveling wave superconducting parametric amplifier as claimed in claim 1, further comprising at least one tapered conductive contact pad, the thinner end of which is electrically connected to one end of the chain of superconducting elements, in which the conductive layer forming a ground plane is structured so as to form, with said conductive contact pad, a coplanar-type transmission line segment (CPW) impedance-matched to the microstrip-type transmission line.

7. The traveling wave superconducting parametric amplifier as claimed in claim 6, further comprising at least one contact pin that is electrically connected to said or to each contact pad through the dielectric layer.

8. The traveling wave superconducting parametric amplifier as claimed in claim 1, wherein at least one dimension of said superconducting elements exhibiting a nonlinear kinetic inductance is spatially modulated so as to define a phase-matching spatial range for an electromagnetic wave.

9. The traveling wave superconducting parametric amplifier as claimed in claim 1, further comprising a generator of a microwave-frequency or radiofrequency pump signal.

10. The traveling wave superconducting parametric amplifier as claimed in claim 1, wherein said superconducting elements exhibiting a nonlinear kinetic inductance are selected from Josephson junctions and superconducting quantum interference devices ("SQUIDs").

11. The traveling wave superconducting parametric amplifier as claimed in claim 10, wherein said superconducting elements exhibiting a nonlinear kinetic inductance are SQUIDs, further comprising a variable magnetic field source generating an adjustable flux through said SQUIDs.

12. A method for producing a traveling wave parametric amplifier as claimed in claim 1, the method comprising the steps of:
    a) producing, on a substrate, using electron beam lithography, metal deposition and oxidation operations, a chain of superconducting elements of Josephson junction or SQUID type connected in series;
    b) producing, by way of atomic layer deposition on top of said substrate, a dielectric layer of sub-micrometer thickness covering said superconducting elements; and
    c) depositing a conductive layer forming a ground plane on top of the dielectric layer.

13. The production method as claimed in claim 12, wherein step a) further comprises producing at least one tapered conductive contact pad, the thinner end of which is electrically connected to one end of the chain of superconducting elements, and step c) further comprises a structuring of the conductive layer so as to form, with said conductive contact pad, a coplanar-type wave line segment impedance-matched to the microstrip-type transmission line formed by the chain of superconducting elements and the ground plane.

14. The production method as claimed in claim 12, further comprising the following step of:
    d) connecting a contact pin to said or to each said contact pad by microsoldering through the dielectric layer.

* * * * *